(12) United States Patent
Takahashi et al.

(10) Patent No.: US 8,350,449 B2
(45) Date of Patent: Jan. 8, 2013

(54) QUARTZ CRYSTAL DEVICE USING AT-CUT QUARTZ SUBSTRATE AND MANUFACTURING THE SAME

(75) Inventors: Takehiro Takahashi, Sayama (JP); Shuichi Mizusawa, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 13/071,553

(22) Filed: Mar. 25, 2011

(65) Prior Publication Data
US 2011/0241492 A1    Oct. 6, 2011

(30) Foreign Application Priority Data

Mar. 30, 2010    (JP) .................................. 2010-077017
Feb. 15, 2011    (JP) .................................. 2011-029328

(51) Int. Cl.
*H01L 41/08* (2006.01)
(52) U.S. Cl. ....................... 310/361; 310/348
(58) Field of Classification Search .................. 310/360, 310/361, 348, 344, 311, 340, 357, 370, 365, 310/366, 367, 368, 320, 321; 117/71, 72, 117/63, 902; *H01I 41/08, 41/053*
See application file for complete search history.

(56) References Cited

U.S. PATENT DOCUMENTS

| 6,707,234 | B1* | 3/2004 | Kawashima | 310/367 |
| 8,026,652 | B2* | 9/2011 | Yasuike | 310/361 |
| 2006/0091765 | A1 | 5/2006 | Oouchi et al. | |
| 2007/0252480 | A1 | 11/2007 | Tsuchido | |
| 2008/0077324 | A1 | 3/2008 | Hatano et al. | |
| 2009/0015106 | A1* | 1/2009 | Tanaya | 310/344 |

FOREIGN PATENT DOCUMENTS

| JP | 61-041215 A | 2/1986 |
| JP | S63-104512 | 5/1988 |
| JP | 2009-232449 | 8/2009 |

* cited by examiner

*Primary Examiner* — Thomas Dougherty
*Assistant Examiner* — Karen B Addison
(74) *Attorney, Agent, or Firm* — Alix, Yale & Ristas, LLP

(57) ABSTRACT

The quartz crystal device of a first aspect comprises a quartz crystal element having an vibrating portion which vibrates when a voltage is applied and a frame portion which surrounds the periphery of the vibrating portion, the quartz crystal element being formed of an AT-cut quartz crystal material specified by the X-axis, the Y'-axis and the Z'-axis; a base which is bonded to one main surface of the frame portion, the base being formed of a Z-cut quartz crystal material specified by the X-axis, the Y-axis and the Z-axis; and a lid which is bonded to other main surface of the frame portion, the frame portion being formed of the Z-cut quartz crystal material. The Z'-axis of the quartz crystal element is coincident with the X-axis or the Y-axis of the base and the lid.

10 Claims, 10 Drawing Sheets

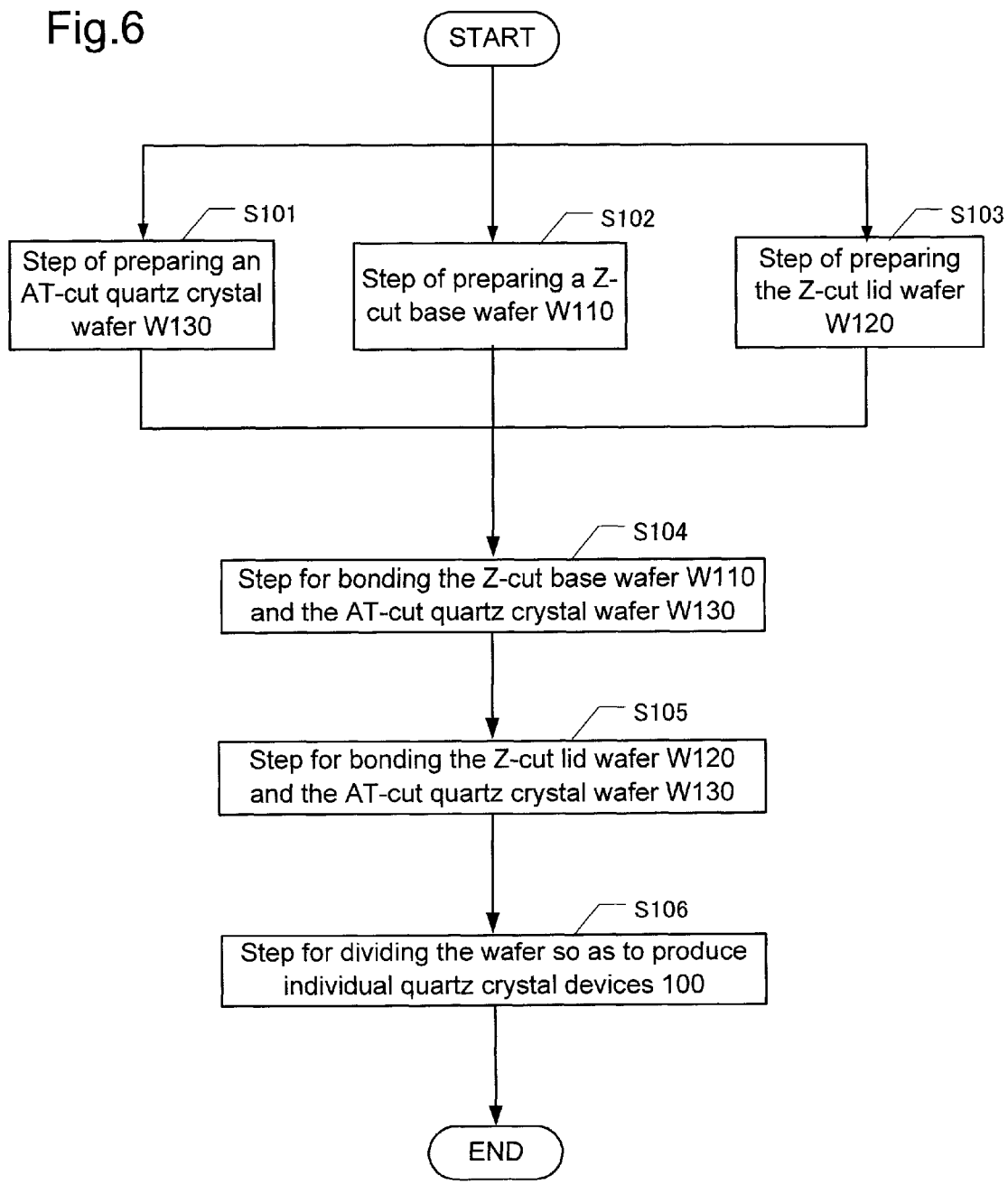

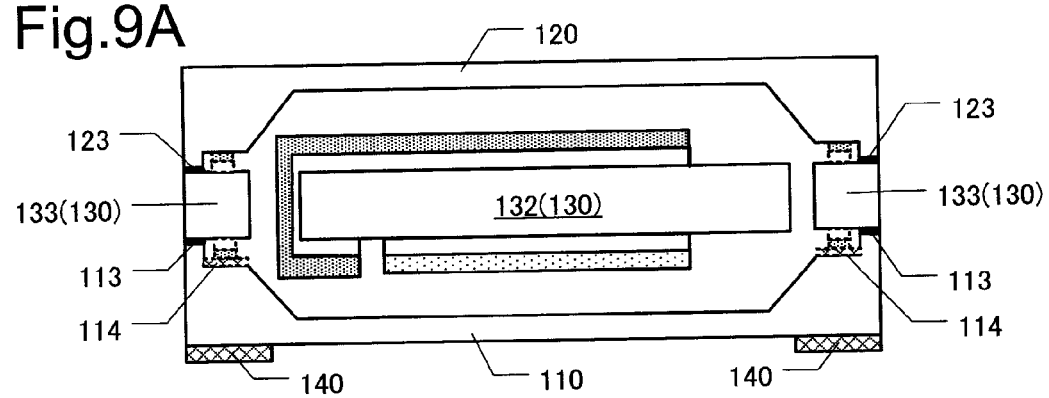
Fig.9A
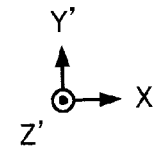
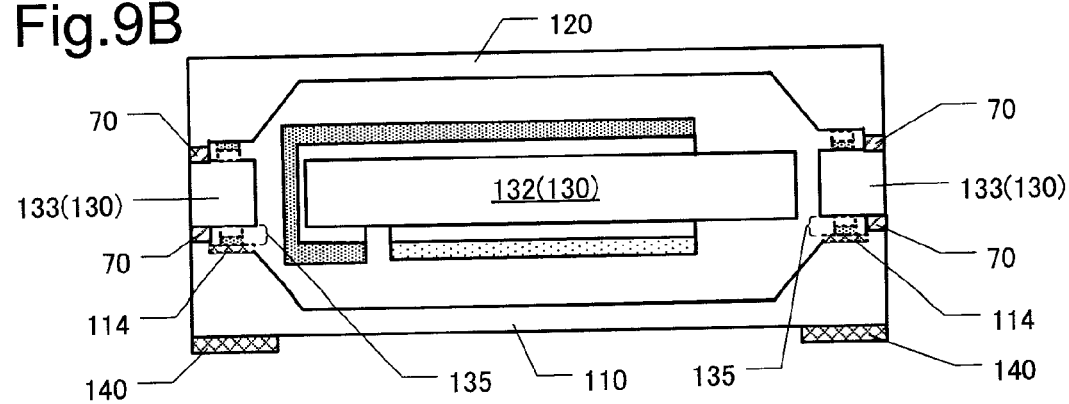
Fig.9B
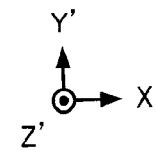

QUARTZ CRYSTAL DEVICE USING AT-CUT QUARTZ SUBSTRATE AND MANUFACTURING THE SAME

CROSS-REFERENCE TO RELATED APPLICATION

This application claims priority to and the benefit of Japan Patent Application No. 2010-077017 filed on Mar. 30, 2010 and Japan Patent Application No. 2011-029328 filed on Feb. 15, 2011 in the Japan Patent Office, the disclosure of which is incorporated herein by reference in its entirety.

FIELD

The present invention relates to a quartz crystal device using an AT-cut quartz substrate and a manufacturing method of the quartz crystal device.

DESCRIPTION OF THE RELATED ART

An AT-cut quartz crystal vibrating piece has been widely used as a reference source for the frequency and time in the vibrator of various types of electronic apparatuses. A surface-mounting type AT-cut quartz crystal vibrating piece is accommodated in a package made of ceramic or glass and the package is sealed off with a lid into a vacuum state or with inert gas filled therein. The AT-cut quartz crystal piece is affected by thermal changes because the coefficient of thermal expansion thereof is different from that of ceramic or glass. In a surface-mounting type quartz crystal device disclosed in Japanese Unexamined Patent Application Publication No. 2009-232449, a package is formed of glass whose coefficient of thermal expansion is close to that of its quartz crystal piece.

Japanese Unexamined Patent Application No. (1986) S61-41215 discloses a technology for bonding a Z-cut quartz crystal piece to an AT-cut quartz crystal piece in order to increase an allowable mechanical strength applied to the AT-cut quartz crystal piece. In the quartz crystal device disclosed in this Patent Document 2, the AT-cut quartz crystal piece and the Z-cut quartz crystal piece bonded together are bonded to an alumina base.

However, although the quartz crystal device disclosed in the 2009-2324495 uses glass whose coefficient of thermal expansion is close to that of the quartz crystal piece, its coefficient of thermal expansion is not equal to that of the quartz crystal piece. Thus, when soldering the quartz crystal device to a printed circuit board, an unreasonable and significant stress might be applied to the package or the AT-cut quartz crystal piece due to a significant temperature change. Although it can be considered to use a package made of AT-cut quartz crystal piece instead of the glass package having a similar coefficient of thermal expansion, the AT-cut quartz crystal piece costs high because of influences of a cutting angle from an artificial quartz crystal.

The S61-41215 does not mention a coefficient of thermal expansion of the quartz crystal device and furthermore, an alumina base is used to solder the quartz crystal device to a printed circuit board.

An object of the present invention is to provide a surface-mounting type quartz crystal device using an AT-cut plate as its vibrating portion to reduce manufacturing cost, the quartz crystal device being unlikely to be broken and insusceptible to changes in frequency due to changes in temperature.

SUMMARY

It is an object of the present invention to provide a quartz crystal device. The quartz crystal device of a first aspect comprises a quartz crystal element having a vibrating portion which vibrates when a voltage is applied and a frame portion which surrounds the periphery of the vibrating portion, the quartz crystal element being formed of an AT-cut quartz crystal material specified by the X-axis, the Y'-axis and the Z'-axis; a base which is bonded to one main surface of the frame portion, the base being formed of a Z-cut quartz crystal material specified by the X-axis, the Y-axis and the Z-axis; and a lid which is bonded to other main surface of the frame portion, the frame portion being formed of the Z-cut quartz crystal material. The Z'-axis of the quartz crystal element is coincident with the X-axis or the Y-axis of the base and the lid.

The quartz crystal device of a second aspect is that the vibrating portion is formed in such a Mesa shape that the thickness of an external peripheral portion thereof is thinner than the thickness of a central portion or in such an inverse-Mesa shape that the thickness of the central portion is smaller than the thickness of the external peripheral portion.

The quartz crystal device of a third aspect is that an excitation electrode for vibrating the vibrating portion is formed on at least one of a ceiling surface of the lid opposed to a main surface of the vibrating portion and a bottom surface of the base opposed to other main surface of the vibrating portion.

The quartz crystal device of a fourth aspect is that the base, the frame portion and the lid are bonded together by siloxane bonding of bonding the Z-cut quartz crystal material directly to the AT-cut quartz crystal material or by adhesive bonding of bonding the Z-cut quartz crystal material to the AT-cut quartz crystal material with adhesive.

The quartz crystal device of a fifth aspect is that a main surface of the quartz crystal element is formed by a long side and a short side, and the short side of the quartz crystal element is parallel to the Z'-axis and the long side is parallel to the X-axis.

The quartz crystal device of a sixth aspect is that the thickness of the base is equal to the thickness of the lid.

A manufacturing method of quartz crystal device of a seventh aspect comprises a step of preparing an AT-cut quartz crystal wafer containing multiple quartz crystal elements having an vibrating portion which vibrates when voltage is applied and a frame portion which surround the periphery of the vibrating portion, the AT-cut quartz crystal wafer being formed of an AT-cut quartz crystal material specified by the X-axis, the Y'-axis and the Z'-axis; a step of preparing a Z-cut base wafer containing multiple bases each to be bonded to a main surface of the frame portion, the Z-cut base wafer being formed of a Z-cut quartz crystal material specified by the X-axis, the Y-axis and the Z-axis; a step of preparing a Z-cut lid wafer containing multiple lids each to be bonded to other main surface of the frame portion, the Z-cut lid wafer being formed of the Z-cut quartz crystal material; a first bonding step of, with the Z'-axis of the AT-cut quartz crystal wafer and the X-axis or the Y-axis of the Z-axis base wafer matched with each other, bonding the Z-cut wafer to a main surface of the AT-cut quartz crystal wafer; a second bonding step of, with the Z'-axis of the AT-cut quartz crystal wafer and the Y-axis of the Z-cut lid wafer matched with each other, bonding the Z-cut lid wafer to other main surface of the AT-cut quartz crystal wafer; and a dividing step of, after the first bonding step and the second bonding step are executed, cutting off the AT-cut quartz crystal wafer, the Z-cut base wafer and the Z-cut lid wafer to individual quartz crystal devices.

The manufacturing method of quartz crystal device of an eighth aspect is that each of the AT-cut quartz crystal wafer, the Z-cut base wafer and the Z-cut lid wafer has a mark (orientation flat or notch) indicating a reference position for specifying each axial direction and in the first bonding step and the second bonding step, the axial directions of the AT-cut quartz crystal wafer, the Z-cut base wafer and the Z-cut lid wafer are matched with each other with reference to the mark.

According to the present invention, there are provided a surface-mounting type quartz crystal device which costs less and is unlikely to be broken and insusceptible to changes in frequency due to changes in temperature.

BRIEF DESCRIPTION OF THE DRAWINGS

FIG. 6 is a flow chart of manufacturing of the quartz crystal device 100;

FIG. 9A is a diagram for explaining siloxane bonding and FIG. 9B is a diagram for explaining bonding with adhesive;

DETAILED DESCRIPTION

Hereinafter, the preferred embodiments of the present invention will be described in detail with reference to the accompanying drawings. In the meantime, the scope of the present invention is not limited to embodiments described here unless it is described that the present invention is limited to any particular embodiments in a following description.

Figure 1A:
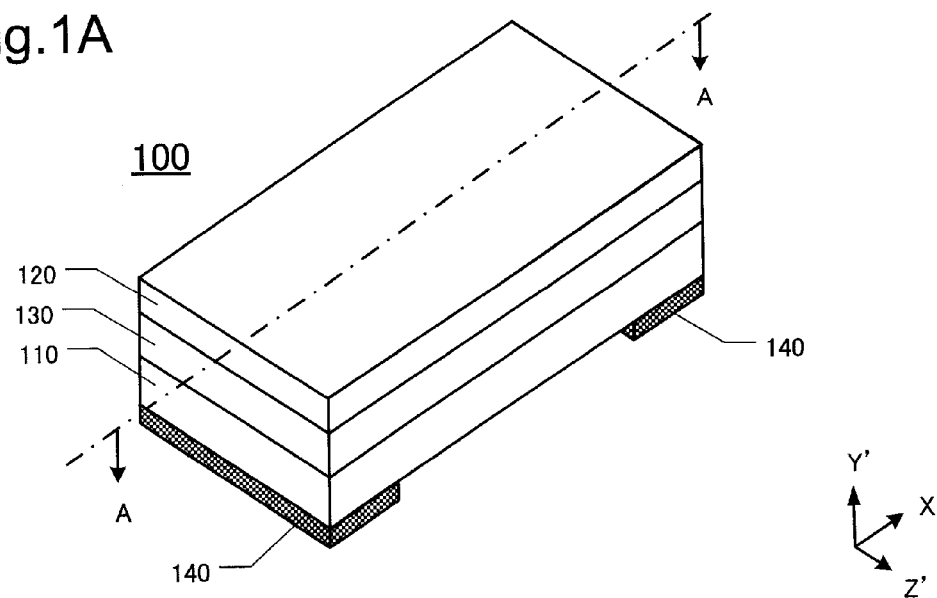
FIG. 1A is a perspective view of a quartz crystal device 100 and FIG. 1B is a sectional view taken along the line A-A of FIG. 1A.
Figure 1B:
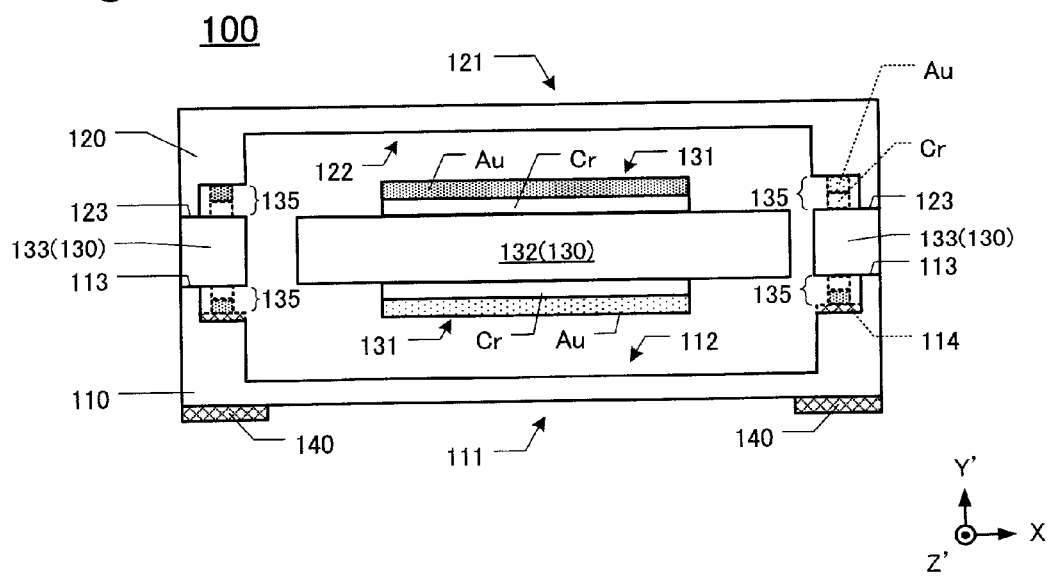
Figure 2A:
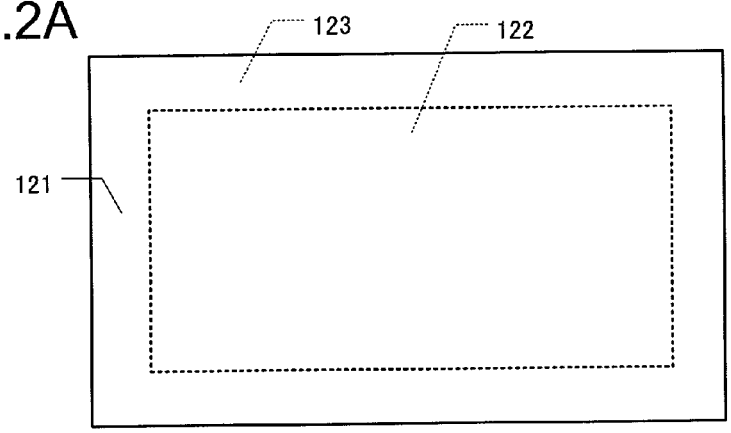
FIG. 2A is a plan view of a lid 120.
Figure 2B:
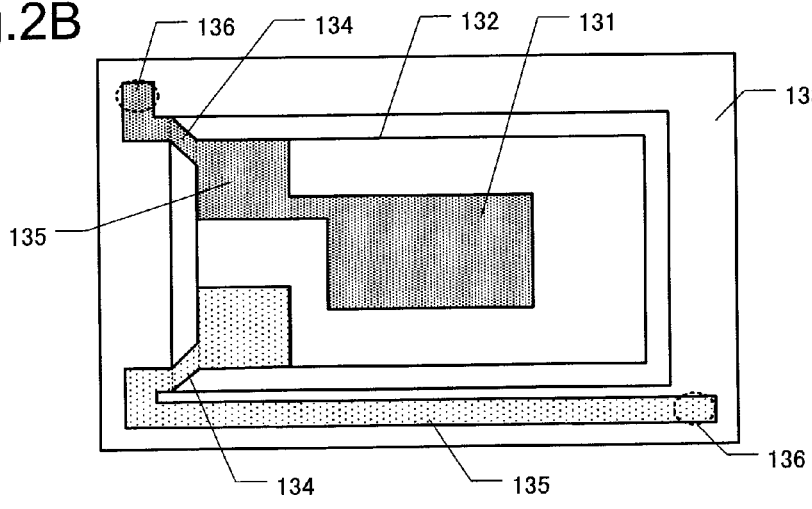
FIG. 2B is a plan view of a quartz crystal element 130 and FIG. 2C is a plan view of a base 110.
Figure 2C:
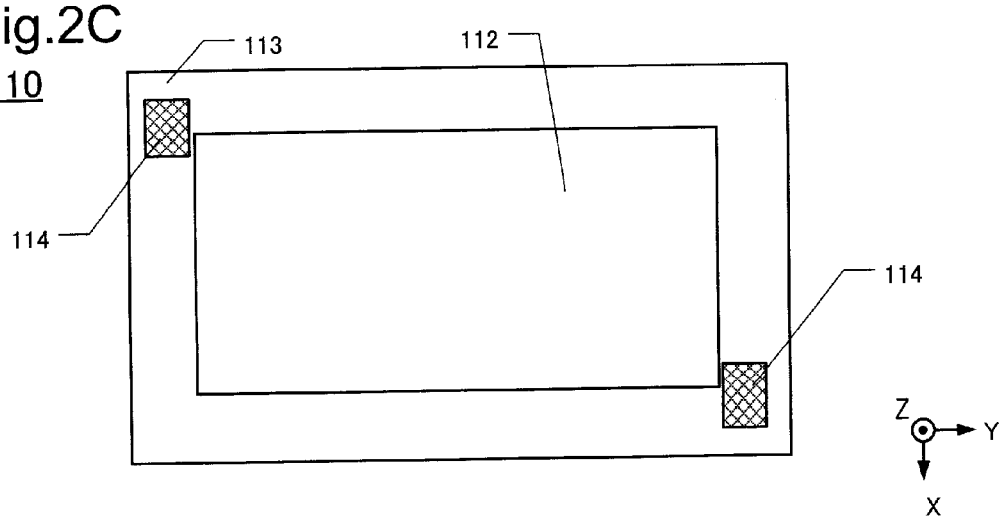

<Configuration of Quartz Crystal Device 100> The quartz crystal device of this embodiment is a surface-mounting type quartz crystal device to be mounted on the surface of a printed circuit board by soldering. Hereinafter, the configuration of the quartz crystal device will be described with reference to FIG. 1 and FIG. 2. FIG. 1A is a perspective view of a quartz crystal device 100 and FIG. 1B is a sectional view taken along the line A-A of FIG. 1A. FIG. 2A is a plan view of a lid 120, FIG. 2B is a plan view of a quartz crystal element 130 and FIG. 2C is a plan view of a base 110.

As shown in FIG. 1A, the quartz crystal device 100 is constituted of the lid 120, the base 110 and the quartz crystal element 130. The quartz crystal element 130 is composed of an AT-cut quartz crystal substrate as its base material. In the AT-cut quartz crystal substrate, its main surface (YZ surface) is tilted about the X-axis by 35° 15" with respect to the Y-axis direction, which is a crystal axis (XYZ), from the Z-axis. In a following description, with the axial direction of the AT-cut quartz crystal substrate as a reference, the new tilted axes are used as a Y'-axis and a Z'-axis. When explaining the quartz crystal device 100, the long side direction of the quartz crystal device 100 is assumed as the X-axis direction, the height direction of the quartz crystal device 100 is assumed as a Y'-axis direction and a direction perpendicular to the X- and Y'-axes is assumed as a Z'-axis direction. For the lid 120 and the base 110, Z-cut quartz crystal substrates are used as their base materials. The crystal axes of the Z-cut quartz crystal substrate are defined with the X-axis. the Y-axis and the Z-axis. When explaining the lid 120 and the base 110 separately in a following description, the axial directions of the Z-cut quartz crystal substrate are used as references.

In the quartz crystal device 100, the lid 120 is disposed on an upper side (+Y'-axis side), the base 110 is disposed on a lower side (−Y'-axis side) and the quartz crystal element 130 is disposed at a position between the lid 120 and the base 110. An external electrode 140 is formed on the bottom face of the base 110.

As shown in FIG. 2A, the lid 120 has a rectangular main surface whose long side is parallel to the Y-axis and whose short side is parallel to the X-axis direction. As shown in FIG. 1B, the lid 120 has an upper surface 121 which is a main surface on the +Z-axis side and a ceiling surface 120 which is a main surface on the −Z-axis side. A bonding surface 123 to be bonded to the quartz crystal element 130 is formed on the external peripheral portion of a face on the −Z-axis side. The ceiling surface 122 is formed such that it is recessed from the bonding surface 123.

As shown in FIG. 2B, the quartz crystal element 130 includes a vibrating portion 132 in which an excitation electrode 131 is formed and a frame portion 133 formed so as to surround the periphery of the vibrating portion 132. The vibrating portion 132 and the frame portion 133 are connected by a connecting arm 134. An extraction electrode 135 is formed from the external peripheral portion of the vibrating portion 132 up to a corner of the frame portion 133 via the connecting arm 134 and part of the frame portion 133. The extraction electrode 135 is connected to a connection electrode 114 (see FIG. 1B and FIG. 2C) formed on the base 110 at a connection point 136 on the corner of the frame portion 133. The electrode formed on the quartz crystal element 130 is constituted of chromium layer Cr formed on the quartz crystal and gold layer (Au) formed on the chromium layer Cr.

As shown in FIG. 2C, the base 110 has a rectangular main surface whose long side is parallel to the Y-axis direction and whose short side is parallel to the X-axis direction. When the base 10 is assembled as part of the quartz crystal device 100, following main surfaces are formed; a lower surface 111 which is located on the −Z-axis side facing the outside portion of the quartz crystal device 100 and a bottom surface 112 which is located on the +Z-axis side facing the inside of the quartz crystal device 100, as shown in FIG. 1B. The bonding surface 113 to be bonded to the frame portion 133 of the quartz crystal element 130 is formed on the external peripheral portion of the +Z-axis side face of the base 110. The bottom surface 112 is formed such that it is recessed from the bonding surface 113. The connection electrodes 114 are formed on the bonding surface 113 of the base 110 and external electrodes 140 are formed on the lower surface 111. The connection electrode 114 is connected electrically to the external electrode 140 via a conductive portion (not shown) formed in the base 110.

In the quartz crystal device 100, the Z-cut quartz crystal substrate is used for the lid 120 and the base 110, and the AT-cut quartz crystal substrate is used for the quartz crystal element 130. Because the Z-cut quartz crystal substrate is cheaper than the AT-cut quartz crystal substrate, the quartz crystal device 100 is capable of reducing manufacturing cost compared to a product using the AT-cut quartz crystal substrates for its lid 120 and the base 110. By using crystal materials for the lid 120 and the base 110, the coefficient of thermal expansion of the quartz crystal element 130 can be brought close to those of the lid 120 and the base 110. The quartz crystal device 100 may be heated close to 400° C. when bonding the lid 120, the base 110 and the quartz crystal element 130 and at the time of reflow soldering. Thus, stress due to thermal expansion is applied between the lid 120, the base 110 and the quartz crystal element 130. Influences of thermal history on the quartz crystal device 100 can be reduced by bringing the coefficients of thermal expansions of the lid 120, the base 110 and the quartz crystal element 130 close to each other. Additionally, using the crystal material for the lid 120 and the base 110 enables application of siloxane bonding, which will be described later, for assembly of the quartz crystal device 100.

<Crystal Axis> Crystal of artificial quartz grows greatly in the Z-axis direction by means of autoclave. The Z-cut quartz crystal substrate is formed by being cut from artificial quartz crystal along the Z-axis direction. Thus, the crystal axes of the Z-cut quartz crystal substrate are defined with the X-axis, the Y-axis and the Z-axis. The AT-cut quartz crystal substrate is formed by cutting artificial crystal along a direction turned by 35° 15' about the X-axis in the Z-axis direction from the Y-axis. Because the cutting directions differ between the Z-cut quartz crystal substrate and the AT-cut quartz crystal substrate, the coefficient of thermal expansion in each axis direction is different despite the same artificial crystal.

In the quartz crystal device 100, influences of thermal expansion when crystal materials are bonded together or at the time of reflow soldering are reduced by using the crystal materials for the quartz crystal element 130, the lid 120 and the base 110. However, when a significant temperature change occurs, for example, when the quartz crystal device 100 is packaged or at the time of reflow soldering, the quartz crystal device 100 sometimes can be broken. For example, the corners of the frame portion 133 of the quartz crystal element 130 and bonding portions between the connecting arm 134, the vibrating portion 132 and the frame portion 133 are susceptible to stress and thus, those portions are likely to be broken.

However, by setting the directions of the crystal axis of the lid 120 and the base 110 and the direction of the crystal axis of the quartz crystal element 130 to particular ones respectively, the breakage rate of the quartz crystal device 100 can be reduced largely. The directions of the crystal axis of the lid 120 and the base 110 and the direction of the crystal axis of the quartz crystal element 130 will be explained with reference to FIG. 3 and FIG. 4.

Figure 3:
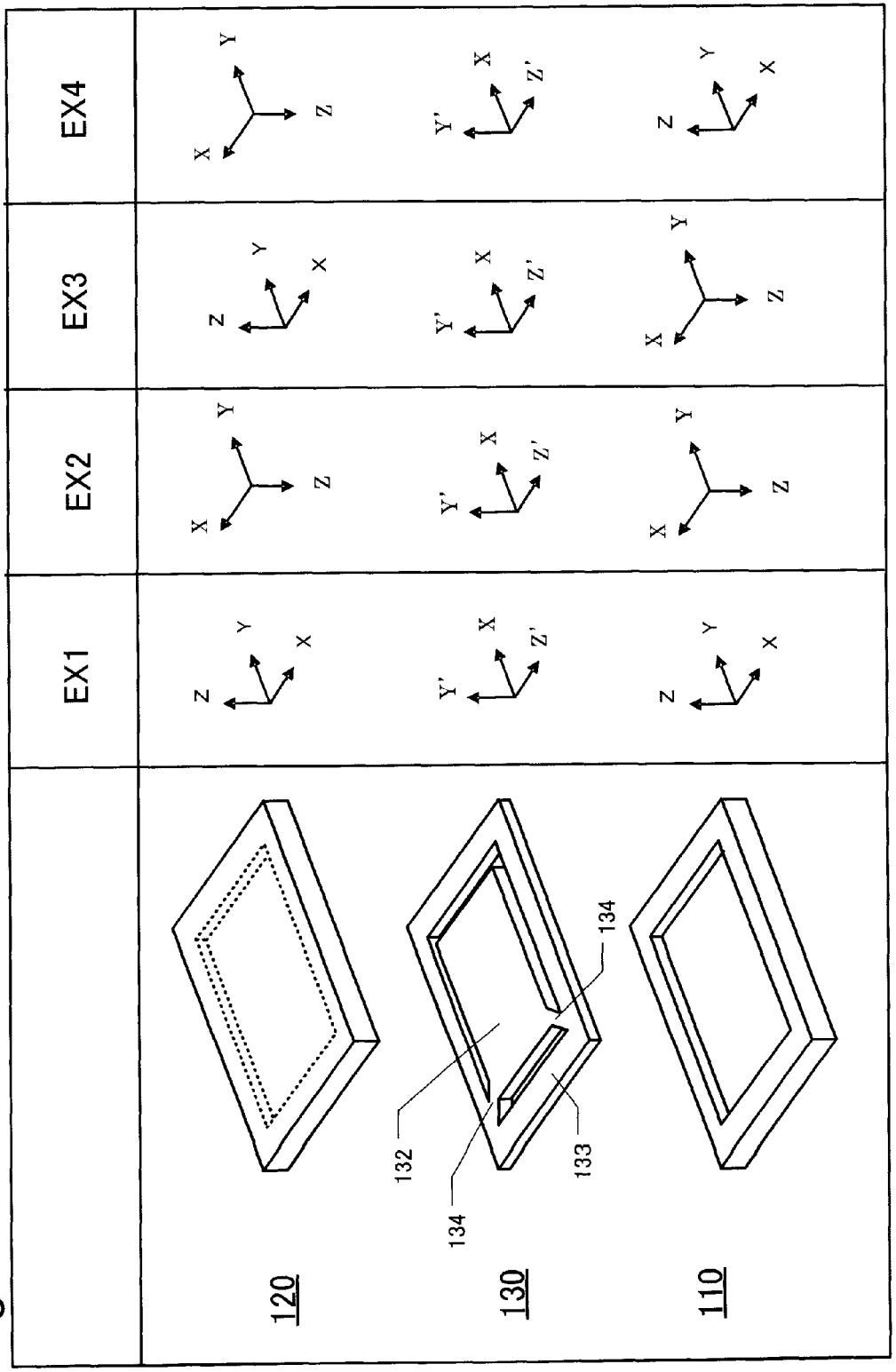
FIG. 3 is a diagram showing combinations of crystal axes of the lid 120, the quartz crystal element 130 and the base 110, having a low breakage rate.
Figure 4:
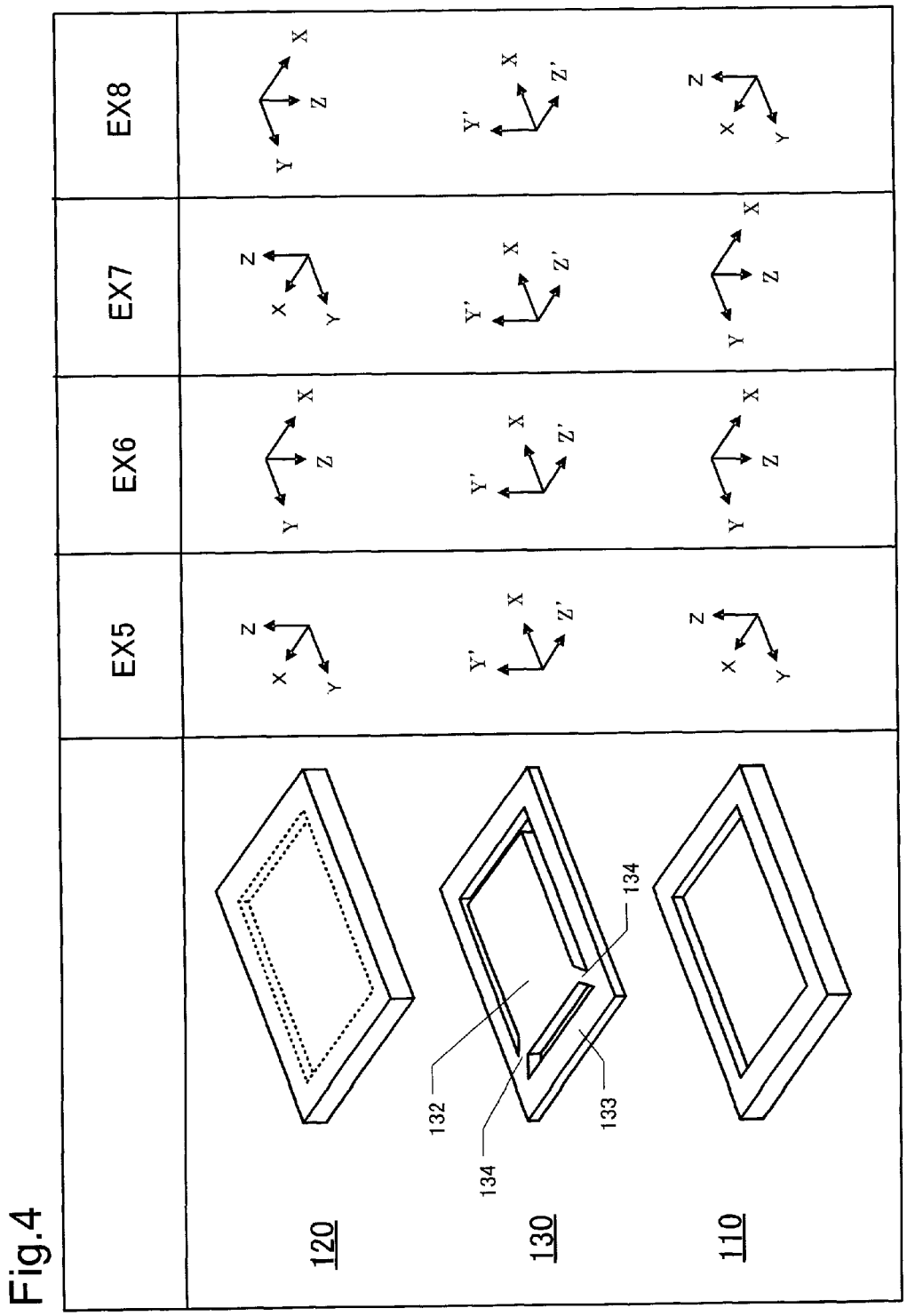
FIG. 4 is a diagram showing combinations of crystal axes of the lid 120, the quartz crystal element 130 and the base 110, having a low breakage rate.

FIG. 3 and FIG. 4 are diagrams showing combinations of the crystal axes of the lid 120, the quartz crystal element 130 and the base 110, having a low breakage rate. Perspective views of the lid 120, the quartz crystal element 130 and the base 110 are shown sequentially from up to down on the left side of FIG. 3 and FIG. 4.

On the right side of the perspective views are shown eight examples EX1 to EX8 concerning the combinations of the crystal axis directions of the lid 120, the quartz crystal element 130 and the base 110. The crystal direction shown on the same row as the lid 120 indicates the crystal direction of the lid 120, the crystal direction shown on the same row as the quartz crystal element 130 indicate the crystal direction of the quartz crystal element 130 and the crystal direction shown on the same row as the base 110 indicates the crystal direction of the base 110. In the eight examples EX1 to EX8, the quartz crystal element 130 is expressed with the crystal axes of the AT-cut quartz crystal substrate and the lid 120 and the base 110 are expressed with the crystal axes of the Z-cut quartz crystal substrate.

In the quartz crystal element 130 composed of the AT-cut quartz crystal substrate, its long side is parallel to the X-axis and its short side is parallel to the Z'-axis. In the lid 120 and the base 110 composed of the Z-cut quartz crystal substrate, their long sides are parallel to the Y-axis and their short sides are parallel to the X-axis.

The first example X1 shown in FIG. 3 is an example of combination in which the +X-axis direction, the +Y'-axis direction and the +Z'-axis direction of the quartz crystal element 130 are coincident with the +Y-axis direction, the +Z-axis direction and the +X-axis direction of the lid 120 and the base 110.

The second example EX2 is an example of combination in which the +X-axis direction, the +Y'-axis direction and the +Z'-axis direction of the quartz crystal element 130 are coincident with the +Y-axis direction, the −Z-axis direction and the −X-axis direction of the lid 120 and the base 110.

The third example EX3 is an example of combination in which the +X-axis direction, the +Y'-axis direction and the +Z'-axis direction of the quartz crystal element 130 are coincident with the +Y-axis direction, the +Z-axis direction and the +X-axis direction of the lid 120, while the +X-axis direction, the +Y'-axis direction and the +Z'-axis direction of the quartz crystal element 130 are coincident with the +Y-axis direction, the −Z-axis direction and the −X-axis direction of the base 110.

The fourth example EX4 is an example of combination in which the +X-axis direction, the +Y'-axis direction and the +Z'-axis direction of the quartz crystal element 130 are coincident with the +Y-axis direction, the −Z-axis direction and the −X-axis direction of the lid 120, while the +X-axis direction, the +Y'-axis direction and the +Z'-axis direction of the quartz crystal element 130 are coincident with the +Y-axis direction, the +Z-axis direction and the +X-axis direction of the base 110.

The fifth example EX5 shown in FIG. 4 is an example of combination in which the +X-axis direction, the +Y'-axis direction and the +Z'-axis direction of the quartz crystal element 130 are coincident with the −Y-axis direction, the +Z-axis direction and the −X-axis direction of the lid 120 and the base 110.

The sixth example EX6 is an example of combination in which the +X-axis direction, the +Y'-axis direction and the +Z'-axis direction of the quartz crystal element 130 are coincident with the −Y-axis direction, the −Z-axis direction and the +X-axis direction of the lid 120 and the base 110.

The seventh example EX7 is an example of combination in which the +X-axis direction, the +Y'-axis direction and the +Z'-axis direction of the quartz crystal element 130 are coincident with the −Y-axis direction, the +Z-axis direction and the −X-axis direction of the lid 120, while the +X-axis direction, the +Y'-axis direction and the Z'-axis direction of the quartz crystal element 130 are coincident with the −Y-axis direction, the −Z-axis direction and the +X-axis direction of the base 110.

The eighth example EX8 is an example of combination in which the +X-axis direction, the +Y'-axis direction and the +Z'-axis direction of the quartz crystal element 130 are coincident with the −Y-axis direction, the −Z-axis direction and the +X-axis direction of the lid 120, while the +X-axis direction, the +Y'-axis direction and the +Z'-axis direction of the quartz crystal element 130 are coincident with the −Y-axis direction, the +Z-axis direction and the −X-axis direction of the base 110.

In the first example EX1 to the eighth example EX8, the X-axis, the Y'-axis and the Z'-axis of the quartz crystal element 130 are coincident with the Y-axis, the Z-axis and the X-axis of the lid 120 and the base 110.

According to a survey by the inventors, it was found that even if heat treatment was executed in a manufacturing process of the quartz crystal element 100 or in a process of loading the quartz crystal element 100 on a mounting substrate, any problem such as generation of cracks in the quartz crystal element 100 and changes in the frequency never occurred. A reason why the combinations shown in FIG. 3 and FIG. 4 are preferable may be estimated from viewpoints of the coefficient of thermal expansion.

Figure 5:
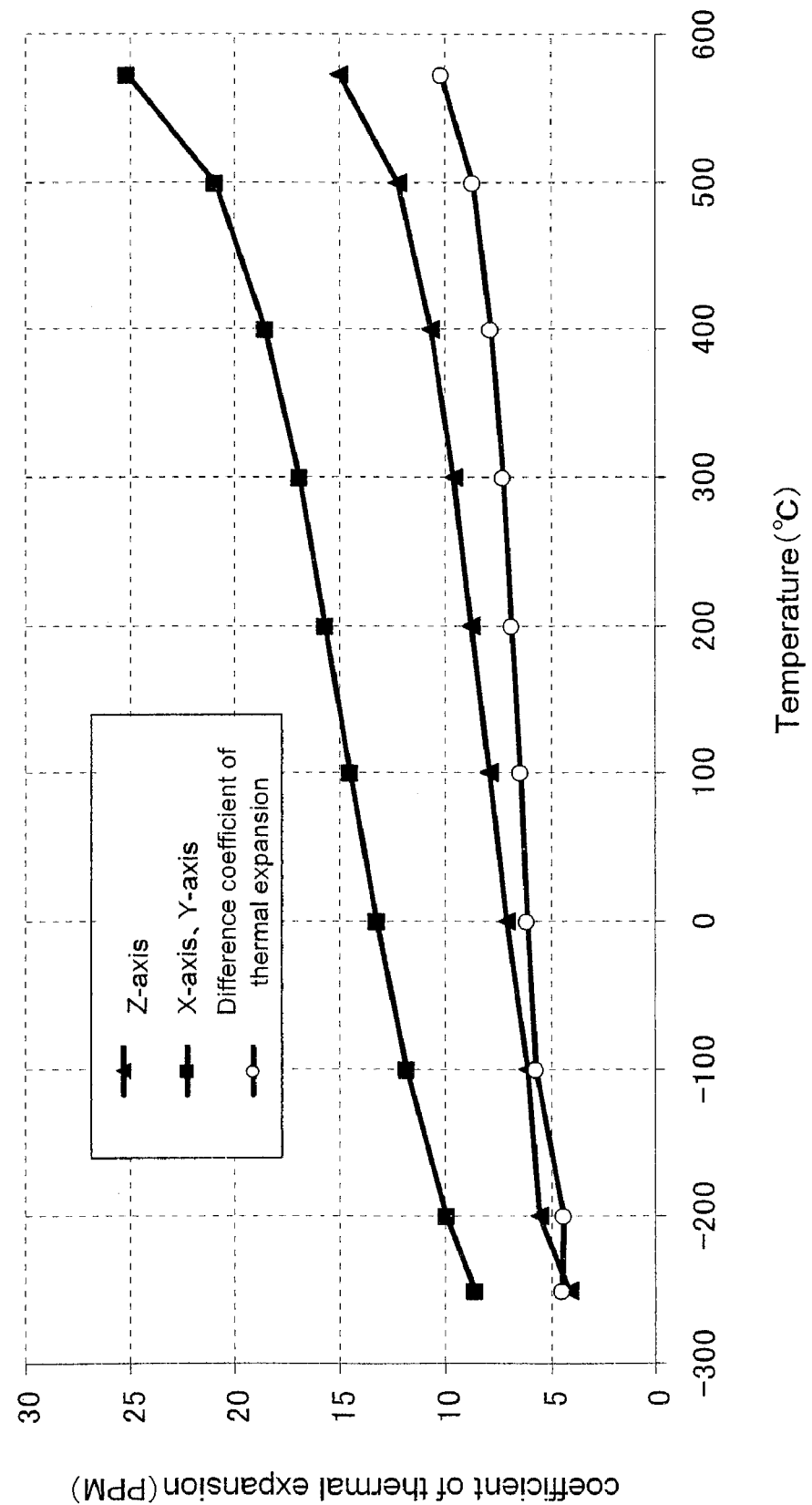
FIG. 5 is a graph showing a relation between the coefficients of thermal expansion of the X-axis, the Y-axis and the Z-axis and the temperature.

FIG. 5 is a graph showing a relation between the coefficient of thermal expansion in the X-axis direction, the Y-axis direction and the Z-axis direction of the crystal material and the temperature. The ordinate of the graph indicates the coefficient of thermal expansion (ppm) and the abscissa of the graph indicates temperatures (° C.). The coefficient of thermal expansion indicates a rate of expansion of the length of an object due to a rise of temperature per 1° C. Triangular dots filled with black in the graph indicate the coefficient of thermal expansion in the Z-axis direction of the crystal material. Square dots filled with black indicate the coefficient of thermal expansion in the X-axis direction and the Y-axis direction of the crystal material. The coefficient of thermal expansion in the Z-axis direction is 4.1 ppm at −250° C. and as the temperature rises, it also rises and reaches 15 ppm at 573° C. The coefficient of thermal expansion in the X-axis direction and the Y-axis direction is 8.6 ppm at −250° C. and as the temperature rises, it also rises and reaches 25.15 ppm at 573° C. Unfilled circular dots in the graph indicates a magnitude of difference between the coefficient of thermal expansion in the X-axis direction and the Y-axis direction and the coefficient of thermal expansion in the Z-axis direction. The difference of the coefficient of thermal expansion between in the X-axis direction/the Y-axis direction and the Z-axis direction is 4.5 ppm at −250° C. and as the temperature rises, the difference of the coefficient of thermal expansion also rises and reaches 10.15 ppm at 573° C.

From the graph shown in FIG. 5, it is found that the coefficients of thermal expansion in the X-axis direction and the Y-axis direction of quartz crystal material are equal and the coefficient of thermal expansion in the X-axis direction and the Y-axis direction is higher than the coefficient of thermal expansion in the Z-axis direction. The Y'-axis direction and the Z'-axis direction of the AT-cut quartz crystal material can be defined by synthesis of the Z-axis direction and the Y-axis direction. That is, because the Y'-axis direction and the Z'-axis direction include components in the Z-axis direction, it can be considered that the coefficient of the Y'-axis direction and the Z'-axis direction is lower than the coefficient of thermal expansion in the X-axis direction and the Y-axis direction. Therefore, when the temperature of a piezoelectric device formed by bonding the AT-cut quartz crystal substrate and the Z-cut quartz crystal substrate rises, stress originating from a difference of the coefficient of thermal expansion between in the Z'-axis direction of the AT-cut quartz crystal substrate and the X-axis/Y-axis direction of the Z-cut quartz crystal substrate is applied to the piezoelectric device. Since the difference of the coefficient of thermal expansion increases as the temperature rises, it is considered that in the piezoelectric device, a probability of occurrence of cracks rises as the temperature rises.

The examples shown in FIG. 3 and FIG. 4 is considered to be in a state in which stress originated from a difference in the coefficient of thermal expansion between the AT-cut quartz crystal substrate and the Z-cut quartz crystal substrate is not applied easily to the piezoelectric device. One of the reasons why stress is not applied easily to the piezoelectric device is considered to be that the Z'-axis direction of the AT-cut quartz crystal substrate having a low coefficient of thermal expansion is parallel to the short side of the piezoelectric device. This reason is considered to be that because the expansion length of quartz crystal material decreases as the length of the quartz crystal material decreases, stress originating from the difference of the coefficient of thermal expansion becomes weaker. Further, it is considered that the lid and the base are formed of the same material and directions of their axes are arranged to be equal to each other. This reason is that stresses applied to a face of the +Y'-axis side and the −Y'-axis side of the quartz crystal element can be equalized. Assuming that different stresses are applied to the face of the +Y'-axis side and the −Y'-axis side of the quartz crystal element, stress is applied to the quartz crystal element in such a direction that the quartz crystal element is warped. If stresses applied to the face of the +Y'-axis side and the face of the −Y'-axis side are equal, the stresses applied to those faces kill each other so that no stress is applied in the direction that the quartz crystal element is warped. To equalize the stresses applied to the face of the +Y'-axis side and the −Y'-axis side, it is considered preferable to form the lid and the base in an equal thickness.

In FIG. 3 and FIG. 4, the X-axis direction, the Y'-axis direction and the Z'-axis direction of the quartz crystal element 130 are coincident with the Y-axis direction, the Z-axis direction and the X-axis direction of the lid 120 and the base 110. On the other hand, because the coefficients of thermal expansion in the X-axis direction and the Y-axis direction are equal to each other, it is considered that the X-axis direction, the Y'-axis direction and the Z'-axis direction of the quartz crystal element 130 may be coincident with the X-axis direction, the Z-axis direction and the Y-axis direction of the lid 120 and the base 110.

<Manufacturing Method of Quartz Crystal Device> Referring to FIG. 6 to FIG. 9, a method for manufacturing the quartz crystal element 100 in which the lid 120 and the base 110 are composed of the Z-cut quartz crystal substrate and the quartz crystal element 130 is composed of the AT-cut quartz crystal substrate will be described.

FIG. 6 is a flow chart of manufacturing of the quartz crystal element 100. In step S101, a step of preparing an AT-cut quartz crystal wafer W130 is executed. In this step, an AT-cut quartz crystal substrate is prepared and then multiple quartz crystal elements 130 are formed on the AT-cut quartz crystal substrate to prepare the AT-cut quartz crystal wafers W130.

Figure 7A:
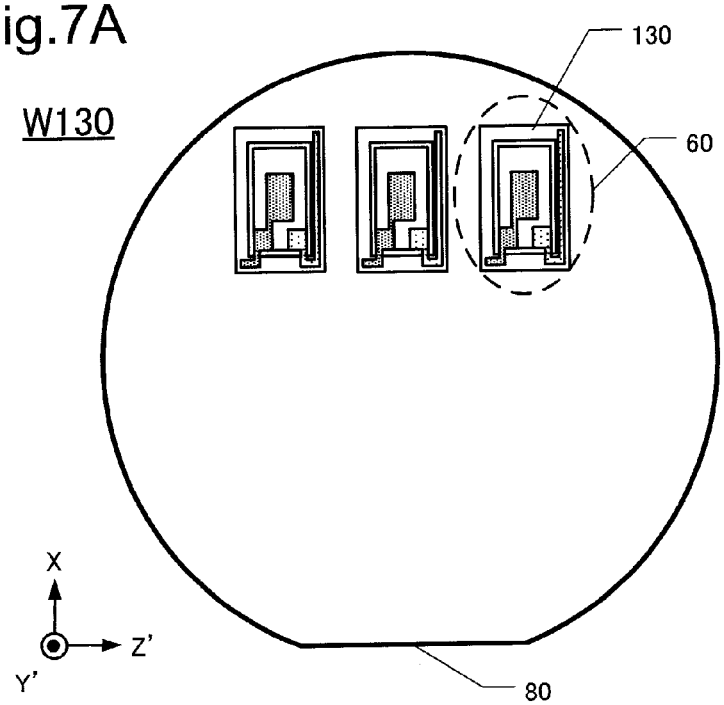
FIG. 7A is a schematic plan view of quartz crystal wafer W130 for the quartz crystal device.

FIG. 7A is a schematic plan view of the AT-cut quartz crystal wafer W130. The AT-cut quartz crystal wafer W130 is produced from the AT-cut quartz crystal substrate and the quartz crystal element 130 is formed on the AT-cut quartz crystal wafer W130 as an AT-cut quartz crystal element. An orientation flat 80 to specify a crystal direction is formed on part of the peripheral portion of the AT-cut quartz crystal wafer W130. A notch may be formed on the AT-cut quartz crystal wafer W130 instead of the orientation flat 80. The diameter of the AT-cut quartz crystal wafer W130 is, for example, 3 inch or 4 inch. Multiple quartz crystal elements 130 are formed on the AT-cut quartz crystal wafer W130. FIG. 7A shows an example in which three quartz crystal elements 130 are formed on the AT-cut quartz crystal wafer W130. A single quartz crystal element 130 is formed within a frame 60 of dotted line.

Figure 7B:
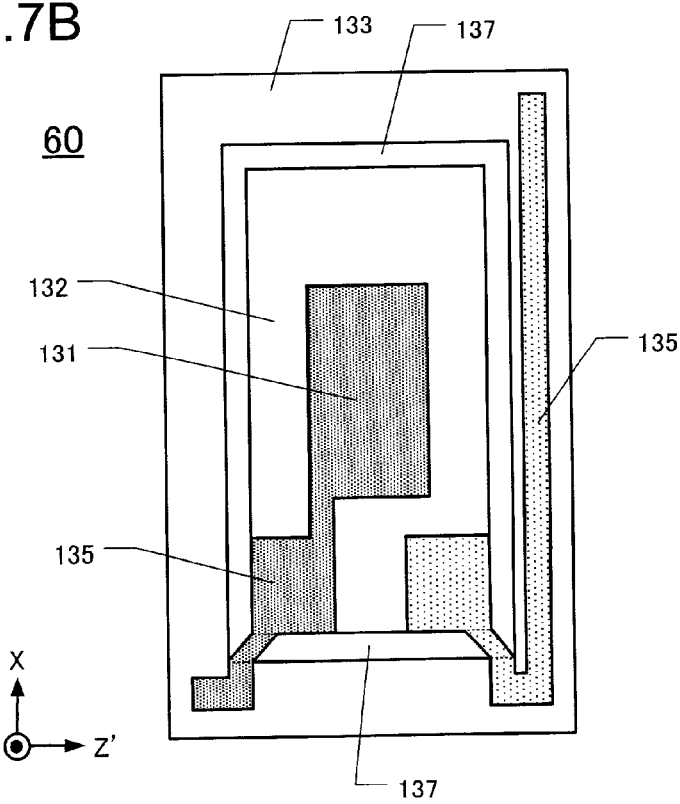
FIG. 7B is an enlarged view of a frame portion 60 indicated with a dotted line in FIG. 7A.

FIG. 7B is an enlarged diagram of the frame 60 of dotted line of FIG. 7A. A groove portion 137 which is a through hole separating the vibrating portion 132 and the frame portion 133 is formed in the AT-cut quartz crystal wafer W130. The excitation electrode 131 and the extraction electrode 135 are formed on the AT-cut quartz crystal wafer W130. In the step of preparing the AT-cut quartz crystal wafer W130 of step S101 shown in FIG. 6, the AT-cut quartz crystal wafer W130 in which the quartz crystal elements 130 are formed is prepared as shown in FIG. 7A and FIG. 7B.

In step S102 of FIG. 6, a step of preparing a Z-cut base wafer W110 is executed. In this step, the Z-cut base wafer W110 is prepared. The Z-cut base wafer W110 uses a Z-cut quartz crystal substrate as its base material and the orientation flat 80 for specifying a crystal direction is formed on part of the peripheral portion. On the Z-cut base wafer W110 are formed multiple recesses of the bottom surface 112 (see FIG. 1B and FIG. 2C) and the external electrodes 140 and the connection electrodes 114 are formed thereon so as to form multiple bases 110.

In step S103, a step of preparing the Z-cut lid wafer W120 is executed. In this step, the Z-cut lid wafer W120 is prepared. The Z-cut lid wafer W120 uses a Z-cut quartz crystal substrate as its base material and the orientation flat 80 for specifying a crystal direction is formed on part of the peripheral portion thereof. On the Z-cut lid wafer W120 are formed multiple recesses of the ceiling surface 122 (see FIG. 1B and FIG. 2A) so as to form the multiple lids 120. The aforementioned steps S101 to step S103 are executed in random order.

In step S104, first bonding step is executed. In the first bonding step, the Z-cut base wafer W110 and the AT-cut quartz crystal wafer W130 are bonded together. The Z-cut base wafer W110 and the AT-cut quartz crystal wafer W130 are superposed accurately along the crystal axes shown in FIG. 3 or FIG. 4 with the orientation flat 80 as a reference. Then, they are bonded together by means of siloxane bonding which will be described later. Upon siloxane bonding, the connection point 136 (see FIG. 2B) of the extraction electrode 135 of the quartz crystal element 130 and the connection electrode 114 (see FIG. 2C) of the base 110 are bonded together firmly.

In step S105, second bonding step is executed. The second bonding step is a step for bonding the Z-cut lid wafer W120 and the AT-cut quartz crystal wafer W130. The Z-cut lid wafer W120 and the AT-cut quartz crystal wafer W130 are superposed accurately along the crystal axes shown in FIG. 3 or FIG. 4 with the orientation flat 80 as a reference. Then, they are bonded together by means of siloxane bonding which will be described later.

The first bonding step of step S104 and the second bonding step of step S105 may be executed in reverse order and at the same time. A final bonding step is executed in vacuum condition or in an environment filled with inert gas under a pressure lower than a specified atmospheric pressure. The frequency of the quartz crystal device 100 is stabilized by keeping the surrounding of the vibrating portion 132 in vacuum condition or filling the surrounding of the vibrating portion 132 with inert gas.

Figure 8:
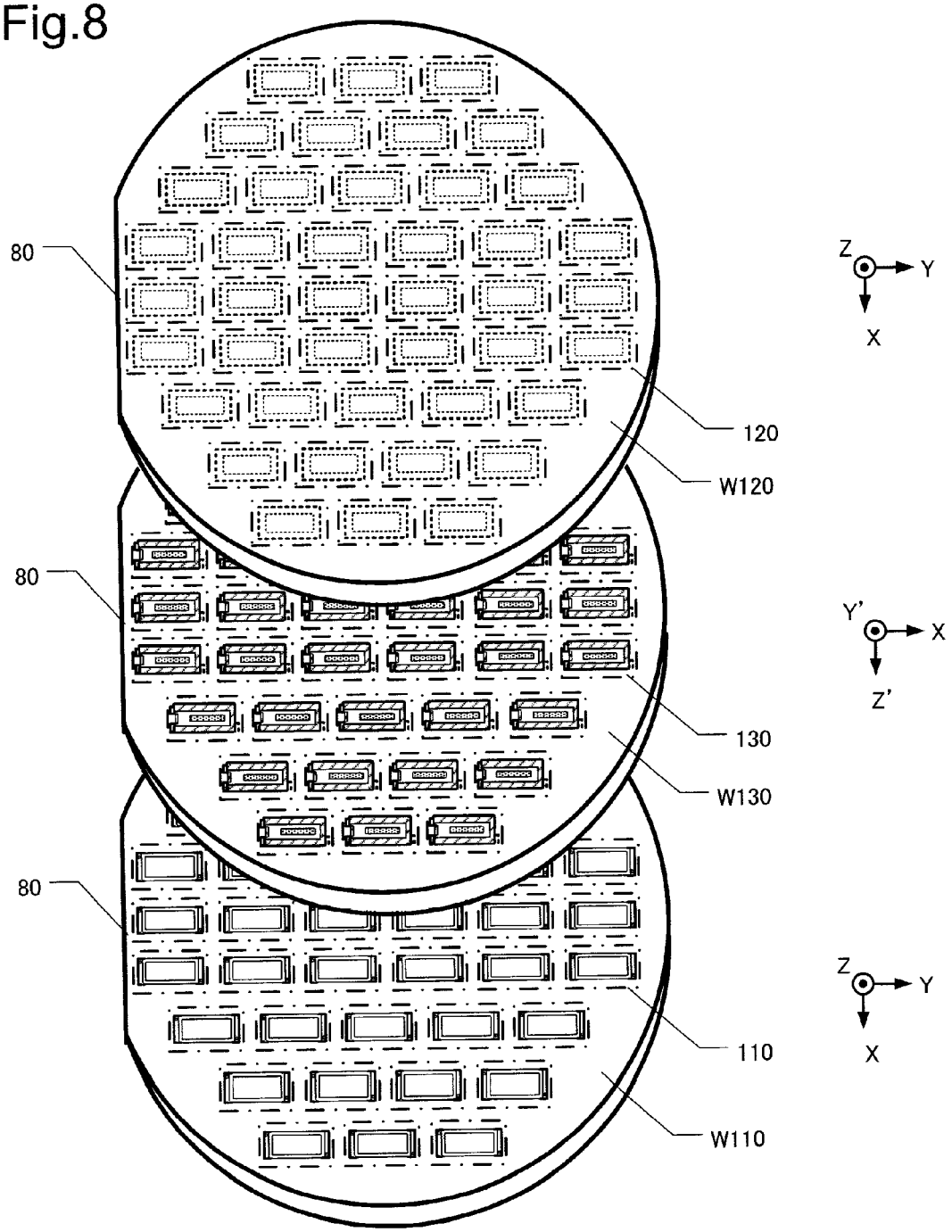
FIG. 8 is a diagram showing a Z-cut lid wafer W120, an AT-cut quartz crystal wafer W130 and a Z-cut base wafer W110 prior to superposing of them.

FIG. 8 is a diagram showing a state prior to superposing the Z-cut lid wafer W120, the AT-cut quartz crystal wafer W130 and the Z-cut base wafer W110 on each other. For convenience of description, the lids 120 are represented on the Z-cut lid wafer W120 with phantom line, the quartz crystal elements 130 are represented on the AT-cut quartz crystal wafer W130 and the bases 110 are represented on the Z-cut base wafer W110. Although for convenience of description, 42 pieces of the lids 120 are represented on the Z-cut lid wafer W120, several hundreds to several thousands pieces of the lids 120 are formed on a single wafer in actual manufacturing. This is the same for the AT-cut quartz crystal wafer W130 and the Z-cut base wafer W110. FIG. 8 shows an example of bonding those wafers based on the directions of the crystal axes of the first example EX1.

When superposing the Z-cut lid wafer W120, the AT-cut quartz crystal wafer W130 and the Z-cut base wafer W110, the orientation flats 80 of the respective wafers are matched with each other accurately. As a result, when superposing the AT-cut quartz crystal wafer and the Z-cut quartz crystal wafer, the wafers are adjusted so that the crystal axes are coincident with each other accurately.

By bonding the Z-cut lid wafer W120, the AT-cut quartz crystal wafer W130 and the Z-cut base wafer W110 together through the first bonding step and the second bonding step, the quartz crystal elements 100 are formed such that they are fixed to the wafers. By packaging the quartz crystal elements 100 at the same time when bonding the electrodes and further manufacturing the quartz crystal elements 100 by the unit of the wafer, manufacturing process can be simplified so as to improve productivity.

Step S106 of FIG. 6 indicates dividing step. The quartz crystal devices 100 are formed in a state in which they are fixed to the wafer in step S105. In dividing step, the quartz crystal devices 100 fixed to the wafer are cut out by means of a dicing saw or laser saw so as to produce individual quartz crystal devices 100.

Bonding of the wafers in step S104 and step S105 is carried out by siloxane bonding or bonding with adhesive. Hereinafter, a bonding method for the wafers shown in the first bonding step of step S104 and the second bonding step of step S105 will be described.

<Siloxane bonding> FIG. 9A is a diagram for explaining siloxane bonding. The quartz crystal element 130 is composed of the AT-cut quartz crystal substrate and the lid 120 and the base 110 are composed of the Z-cut quartz crystal substrate. Thus, siloxane bonding (Si—O—Si bond) may be used for bonding the respective wafers together. Siloxane bonding is a method for bonding quartz crystals directly without any adhesive.

In siloxane bonding, as pretreatment, with the bonding surface 113 of the base 110, the faces of the +Y'-axis side and the −Y'-axis side of the frame portion 133 and the bonding surface 123 of the lid 120 kept in mirror condition, the respective surfaces are activated by irradiating short-wavelength ultra-violet rays in oxygen contained environment and kept clean. After the respective surfaces are activated, the respective wafers are positioned and superposed in vacuum condition or in inert-gas contained environment and then the wafers are pressed against each other while heated at a relatively low temperature of 100° C. to 200° C. In this way, the respective wafers are bonded with each other firmly by siloxane bonding. As the pretreatment method, a method using plasma processing and a method of irradiating ion beam to the bonding surfaces as well as the method using ultraviolet rays are well known.

<Bonding with adhesive> FIG. 9B is a diagram for explaining bonding with adhesive. In FIG. 9B, using polyimide-base adhesive 70, the lid 120 and the quartz crystal element 130 are bonded together and the base 110 and the quartz crystal element 130 are bonded together. The lid 120/the quartz crystal element 130, and the base 110/the quartz crystal element 130 are bonded to each other respectively such that a sealed condition is maintained in the quartz crystal device 100. At the same time when bonding is executed, the extraction electrode 135 and the connection electrode 114 are connected to each other.

<Modification of Quartz Crystal Device 100> The quartz crystal device 100 may be composed of an AT-cut quartz crystal device having a different shape from the quartz crystal element 130. An example of a quartz crystal device using an AT-cut quartz crystal element having a different shape from the quartz crystal element 130 is shown below.

Figure 10A:
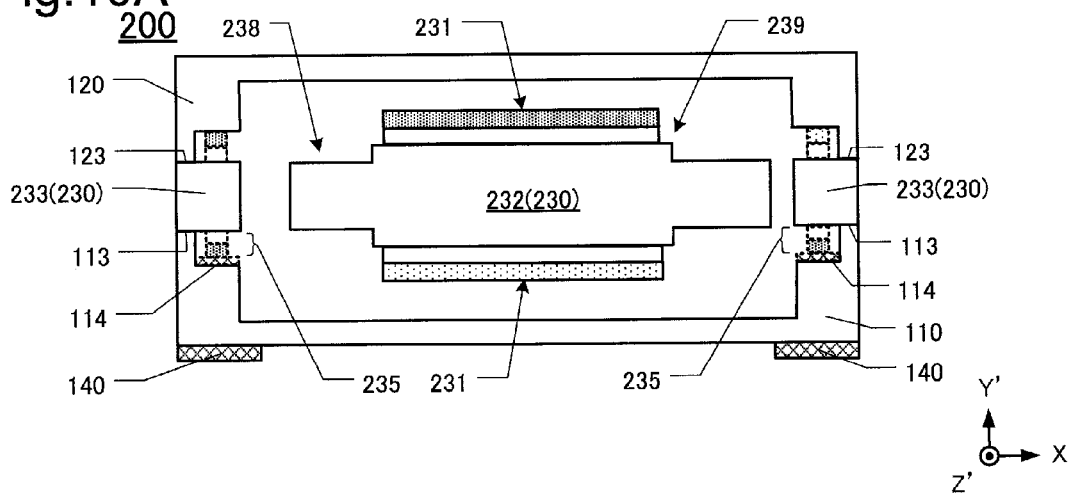
FIG. 10A is a sectional view of a quartz crystal device 200.

<Configuration of Quartz Crystal Device 200> FIG. 10A is a sectional view of the quartz crystal device 200. The quartz crystal device 200 is constituted of a Z-cut lid 120, a Z-cut base 110 and an AT-cut quartz crystal device 230. In the quartz crystal device 200, the Z-cut lid 120 is disposed on an upper portion (+Y'-axis side), the Z-cut base 110 is disposed on a bottom portion (−Y'-axis side) and the quartz crystal device 230 is disposed at a position sandwiched by the Z-cut lid 120 and the Z-cut base 110. The Z-cut lid 120 and the Z-cut base 110 have the same shape as the quartz crystal device 100. The quartz crystal device 230 has a vibrating portion 232 and a frame portion 233, which are connected to each other with a connecting arm (not shown). The quartz crystal device 230 is a Mesa-type quartz crystal device so constructed that the thickness of a peripheral portion 238 of the vibrating portion 232 is thinner than the thickness of a central portion 239. An excitation electrode 231 is formed on each of the +Y'-axis side and the −Y'-axis side of the central portion 239 and extraction electrodes 235 are formed on the frame portion 233 such that they are extracted from the excitation electrode 231.

Figure 10B:
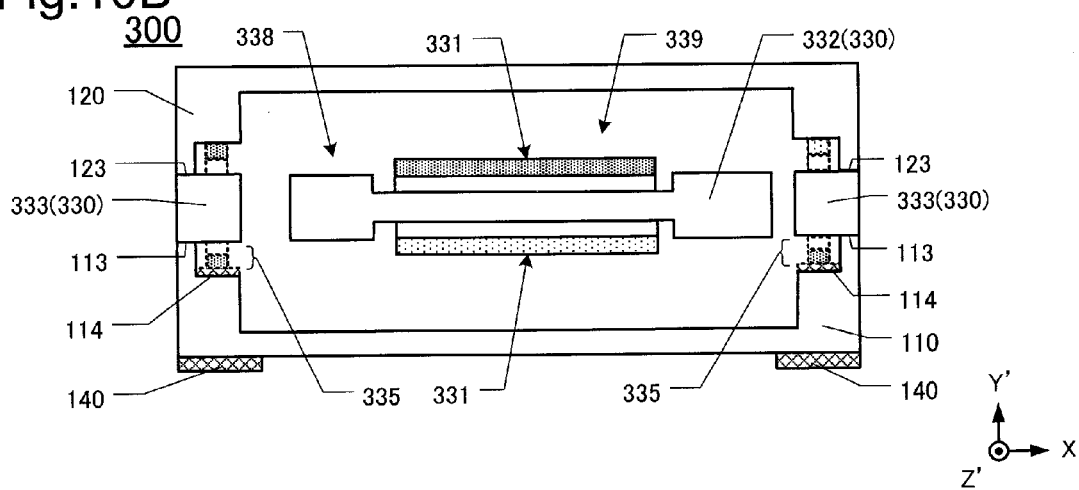
FIG. 10B is a sectional view of a quartz crystal device 300 and FIG. 10C is a sectional view of a quartz crystal device 400.

<Configuration of Crystal Device> FIG. 10B is a sectional view of a quartz crystal device 300. The quartz crystal device 300 is constituted of the Z-cut lid 120, the Z-cut base 110 and an AT-cut quartz crystal device 330. In the quartz crystal device 300, the Z-cut lid 120 is disposed on an upper portion, the Z-cut base 110 is disposed on a bottom portion and the quartz crystal device 330 is disposed at a position sandwiched by the Z-cut lid 120 and the Z-cut base 110. The Z-cut lid 120 and the Z-cut base 110 have the same shape as the quartz crystal device 100. The quartz crystal device 330 has a vibrating portion 332 and a frame portion 333, which are connected to each other with a connecting arm (not shown). The vibrating portion 332 is an inverse-Mesa type quartz crystal device so constructed that the thickness of a central portion 339 is smaller than the thickness of a peripheral portion 338. An excitation electrode is formed on each of the +Y'-axis side and the −Y'-axis side of the central portion 339 and extraction electrodes 335 are formed on the frame portion 333 such that they are extracted from the excitation electrode 331.

Figure 10C:
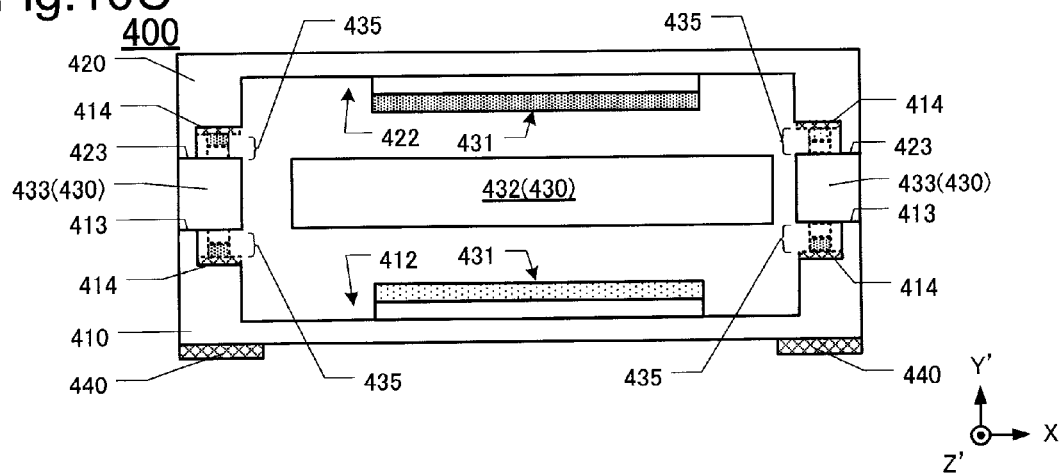

<Configuration of Quartz Crystal Device 400> FIG. 10C is a sectional view of a quartz crystal device 400. The quartz crystal device 400 is constituted of a Z-cut lid 420, a Z-cut base 410 and an AT-cut quartz crystal device 430. In the quartz crystal device 400, the Z-cut lid 420 is disposed on an upper portion, the Z-cut base 410 is disposed on a bottom portion and the quartz crystal device 430 is disposed at a position sandwiched by the Z-cut lid 420 and the Z-cut base 410. The quartz crystal device 430 has a vibrating portion 432 and a frame portion 433, which are connected to each other with a connecting arm (not shown). No excitation electrode is formed on the main surfaces of the +Y'-axis side and the −Y'-axis side of the vibrating portion 430. The excitation electrodes 431 are formed on a ceiling surface 422 of the Z-cut lid 420 and a bottom surface 412 of the Z-cut base 410. The vibrating portion 432 is vibrated at thickness-shear mode by electric field produced on the vibrating portion 432 by both the excitation electrodes 431.

The excitation electrode 431 formed on the Z-cut lid 420 is connected to a connection electrode 414 formed near the external peripheral portion of the −Y'-axis side of the Z-cut lid 420. The connection electrode 414 of the Z-cut lid 420 is connected electrically to the connection electrode 414 formed on the Z-cut base 410 via an extraction electrode 435 formed on the frame portion 433 of the quartz crystal 430. Further, because the connection electrode 414 is connected electrically to an external electrode 440, the excitation electrode 431 formed on the Z-cut lid 420 is connected electrically to the external electrode 440. As other method for connecting electrically the excitation electrode 431 formed on the Z-cut lid 420 to the external electrode 440, an electrode for connecting directly the excitation electrode 431 formed on the Z-cut lid 420 to the external electrode 440 may be formed on an external wall of the quartz crystal device 430.

Although in FIG. 10C, the excitation electrode 431 is formed on the ceiling surface 422 and a bottom surface 412, it is permissible to form the excitation electrode on any one of the ceiling surface 422 and the bottom surface 412 and then form another excitation electrode 431 on the surface of the vibrating portion 432 opposed to the ceiling surface 422 or the bottom surface 412 in which no excitation electrode 431 is formed. For example, one excitation electrode 431 is formed on the +Y'-axis side of the vibrating portion 432 and the other excitation electrode 431 is formed on the bottom surface 412 of the Z-cut base 410. In this way, no electrode needs to be formed on the Z-cut lid 420 and thereby the formation process of the Z-cut lid 420 can be simplified.

The vibrating portion 432 of the quartz crystal device 430 of the quartz crystal device 400 may be formed in Mesa shape or inverse-Mesa shape. The aforementioned quartz crystal devices 200, 300 and 400 are constructed by bonding their components in the crystal directions shown in FIG. 3 and FIG. 4.

Although the preferred embodiments of the present invention have been described in detail above, as evident to those skilled in the art, these embodiments may be carried out by means of a variety of changes and modifications within the technical scope of the invention.

What is claimed is:

1. A quartz crystal device comprising:
   a quartz crystal element having a vibrating portion which vibrates when a voltage is applied and a frame portion which surrounds the periphery of the vibrating portion, the quartz crystal element being formed of an AT-cut quartz crystal material specified by the X-axis, the Y'-axis and the Z'-axis;
   a base which is bonded to a first main surface of the frame portion, the base being formed of a Z-cut quartz crystal material specified by the X-axis, the Y-axis and the Z-axis; and
   a lid which is bonded to a second main surface of the frame portion, the frame portion being formed of the Z-cut quartz crystal material,
   wherein the Z'-axis of the quartz crystal element is coincident with the X-axis or the Y-axis of the base and the lid.

2. The quartz crystal device according to claim 1, wherein the vibrating portion is formed in such a Mesa shape that the thickness of an external peripheral portion thereof is thinner than the thickness of a central portion or in such an inverse-Mesa shape that the thickness of the central portion is smaller than the thickness of the external peripheral portion.

3. The quartz crystal device according to claim 1, wherein an excitation electrode for vibrating the vibrating portion is formed on at least one of a ceiling surface of the lid opposed to a first main surface of the vibrating portion and a bottom surface of the base opposed to a second main surface of the vibrating portion.

4. The quartz crystal device according to claim 1, wherein the base, the frame portion and the lid are bonded together by siloxane bonding of bonding the Z-cut quartz crystal material directly to the AT-cut quartz crystal material or by adhesive bonding of bonding the Z-cut quartz crystal material to the AT-cut quartz crystal material with adhesive.

5. The quartz crystal device according to claim 2, wherein the base, the frame portion and the lid are bonded together by siloxane bonding of bonding the Z-cut quartz crystal material directly to the AT-cut quartz crystal material or by adhesive bonding of bonding the Z-cut quartz crystal material to the AT-cut quartz crystal material with adhesive.

6. The quartz crystal device according to claim 1, wherein a main surface of the quartz crystal element is bounded by a long side and a short side of the quartz crystal element, and the short side of the quartz crystal element is parallel to the Z'-axis and the long side is parallel to the X-axis.

7. The quartz crystal device according to claim 2, wherein a main surface of the quartz crystal element is bounded by a long side and a short side of the quartz crystal element, and the short side of the quartz crystal element is parallel to the Z'-axis and the long side is parallel to the X-axis.

8. The quartz crystal device according to claim 1, wherein the base and the lid each have a thickness, the thickness of the base is equal to the thickness of the lid.

9. The quartz crystal device according to claim 2, wherein the base and the lid each have a thickness and the thickness of the base is equal to the thickness of the lid.

10. The quartz crystal device according to claim 3, wherein the base and the lid have a thickness and the thickness of the base is equal to the thickness of the lid.

* * * * *